(12) United States Patent
Taniguchi et al.

(10) Patent No.: US 6,674,114 B2
(45) Date of Patent: Jan. 6, 2004

(54) SEMICONDUCTOR DEVICE AND MANUFACTURING METHOD THEREOF

(75) Inventors: Toshimitsu Taniguchi, Gunma (JP); Shinya Mori, Saitama (JP); Shinzo Ishibe, Gunma (JP); Akira Suzuki, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/059,870

(22) Filed: Jan. 29, 2002

(65) Prior Publication Data

US 2002/0102780 A1 Aug. 1, 2002

(30) Foreign Application Priority Data

Jan. 30, 2001 (JP) .................................... P. 2001-021222

(51) Int. Cl.[7] ............................................ H01L 27/108
(52) U.S. Cl. ...................................................... 257/303
(58) Field of Search ................................. 257/303, 296

(56) References Cited

U.S. PATENT DOCUMENTS

| 4,975,756 A | * | 12/1990 | Haken et al. ................. 357/4.1 |
| 5,998,843 A | * | 12/1999 | Yoshida ........................ 257/370 |
| 6,143,594 A | * | 11/2000 | Tsao et al. .................... 438/199 |
| 6,410,375 B1 | * | 6/2002 | Lee .............................. 438/199 |
| 6,512,258 B2 | * | 1/2003 | Maeda ......................... 257/303 |

* cited by examiner

*Primary Examiner*—David Nelms
*Assistant Examiner*—Thao P Le
(74) *Attorney, Agent, or Firm*—Fish & Richardson P.C.

(57) ABSTRACT

In a semiconductor device having P type and N type wells formed bordering on a step on a P type semiconductor substrate, a first transistor (precise transistor) having a first linewidth is formed on the P type well in a step lower region while a second transistor (high-voltage transistor) having a second linewidth greater than a linewidth of the first transistor is formed on the N type well in a step higher region.

5 Claims, 18 Drawing Sheets

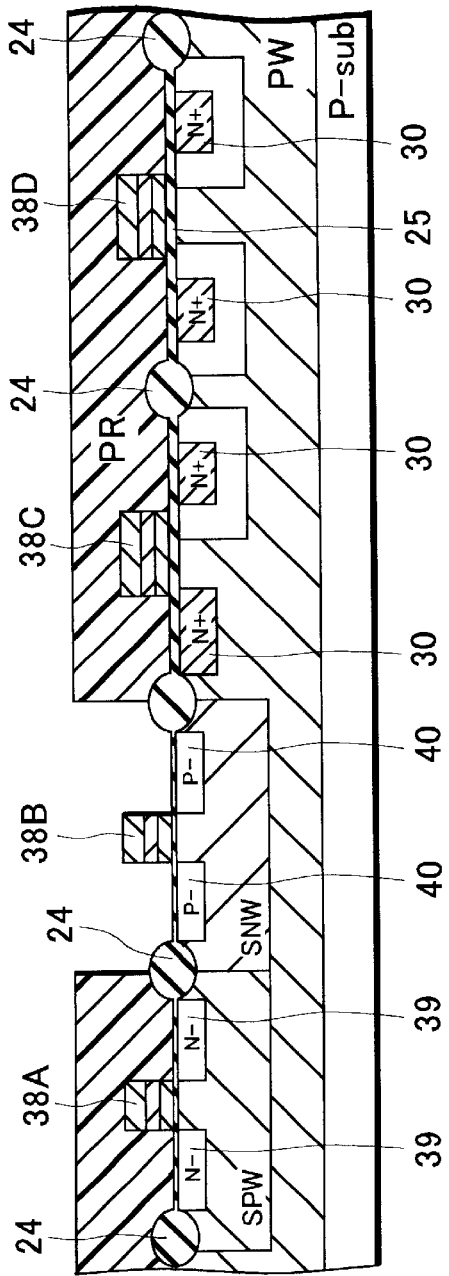
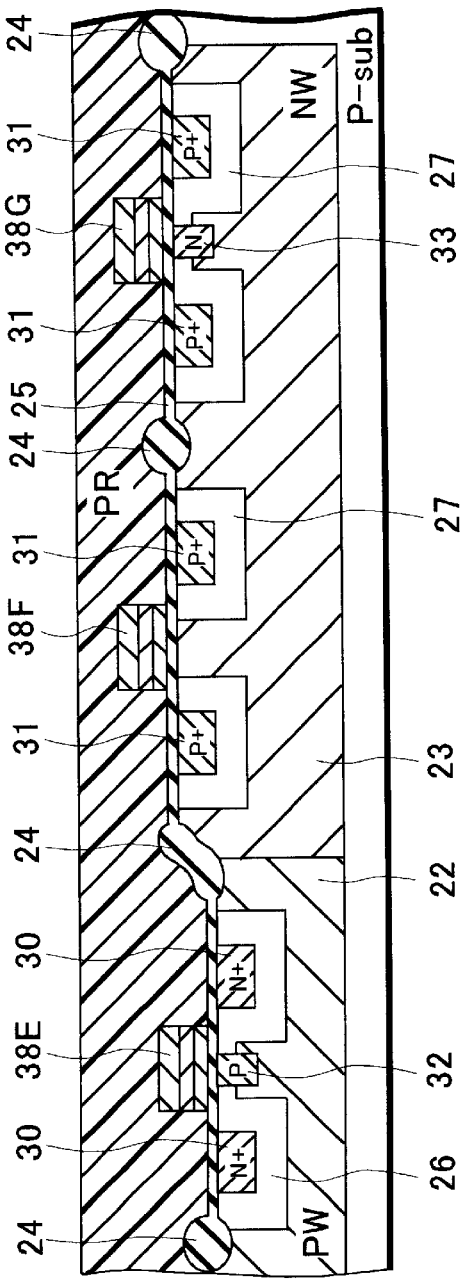

SEMICONDUCTOR DEVICE AND MANUFACTURING METHOD THEREOF

BACKGROUND OF THE INVENTION

The present invention relates to a semiconductor device and manufacturing method thereof and, more particularly, a structure of and manufacturing method of a CMOS transistor in a CMOS process using the LOCOS technique.

Explanation is made below on the conventional semiconductor device and manufacturing method thereof, with reference to the drawings.

In FIG. 19, numeral 51 denotes a semiconductor substrate (P-sub), wherein an N type well (NW) 52 and a P type well (PW) 53 are formed in the substrate 51. A first (P-channel) MOS transistor is constituted to have a first gate electrode 55A formed on the N type well 52 through a first gate oxide film 54A and first (P type) source/drain regions 56 formed in the vicinity of the gate electrode 55A. A second (N-channel) MOS transistor is constituted to have a second gate electrode 55B formed on the P type well 53 through a second gate oxide film 54B and second (N type) source/drain regions 57 formed in the vicinity of the gate electrode 55B. Meanwhile, numeral 58 denotes a device isolation film.

Explained in the below is a method of manufacturing a semiconductor device in the above. At first, a pad oxide film 60 and silicon nitride film 61 is formed in a predetermined region (region for a P type well 53) on the semiconductor substrate 51, as shown in FIG. 20. Thereafter, using the pad oxide film 60 and silicon nitride film 61 as a mask, phosphorus ion ($^{31}P^+$), for example, is ion-implanted to the substrate surface to form an ion-implant region 62.

Subsequently, as shown in FIG. 21, the silicon nitride film 61 is used as a mask to oxidize the substrate surface by a LOCOS technique thereby forming a LOCOS film 63. At this time, the phosphorus ion implanted in the region beneath the LOCOS film 63 is diffused toward the inward of the substrate thus forming an N type region 64.

Next, as shown in FIG. 22, the pad oxide film 60 and silicon nitride film 61 is removed away. Thereafter, the LOCOS film 63 is used as a mask to ion-implant boron ion ($^{11}B^+$) to the substrate surface thereby forming an ion-implant region 65.

Then, as shown in FIG. 23, after removing the LOCOS film 63, the impurity ions implanted in the substrate 51 are thermally diffused to form an N type well 52 and a P type well 53.

Subsequently, as shown in FIG. 24, after forming a device isolation film 58 in the border at between the N type well 52 and the P type well 53, a gate oxide film 54 is formed on the other region than the device isolation film 58 to form thereon a conductor film 55. Furthermore, by patterning the conductor film 55, a first gate electrode 55A is formed on the N type well 52 through a first gate oxide film 54A and, similarly, a second gate electrode 55B is formed on the P type well 53 through a second gate oxide film 54B.

Then, in the state that a resist film is formed on the region for a second MOS transistor, ion is implanted through the first gate electrode 55A as a mask. Thus, P type source/drain regions 56 are formed in the vicinity of the first gate electrode 55A thereby constituting a first MOS transistor. N type source/drain regions 57 are formed in the vicinity of the second gate electrode 55B thereby constituting a second MOS transistor.

Herein, the above CMOS structure utilizes the LOCOS technique in order to separately form the N type well 52 and the P type well 53. Consequently, the N type well 52 formed in the region removed of the LOCOS film 53 is lower in position than the P type well 53 (see FIG. 23).

Accordingly, in the region such a step is caused as shown in FIG. 24, when the conductor film 55 on the gate oxide film 54 is patterned to form a gate electrode, an organic thin film 66 (BARC: Bottom Anti-Reflection Coating) is applied as a reflection preventing film beneath a resist film 67 in order to prevent linewidth variation due to the standing wave or halation in the step.

However, the organic BARC, applied by spin coating, has a thickness increased in the step lower region and decreased in the step higher region (see FIG. 24). Consequently, where working a precise BARC (e.g. 0.35 μm) by dry etching, a variation in linewidth occurs between the gate electrode on the step lower region and the gate electrode on the step higher region due to the difference in BARC thickness at between the step lower region and the step higher region. Incidentally, FIG. 25 shows the state that the BARC is left in the step lower region due to insufficient amount of BARC etching (the organic thin film 66A and the organic thin film 66B equivalent in width) whereas FIG. 26 shows the state that there is a variation in linewidth caused between the gate electrodes due to a difference in BARC etch amount (the organic thin film 66D is smaller in width as compared to the organic thin film 66C (removal amount on the organic thin film 66: X1<X2)).

SUMMARY OF THE INVENTION

Accordingly, the present invention has been made in view of the foregoing problem, which comprises, in a semiconductor device having one-conductivity type and opposite-conductivity type semiconductor regions formed having a step as a border on a one-conductivity type semiconductor substrate, a first transistor having a first linewidth in either a semiconductor region in one conductivity type or a semiconductor region in opposite conductivity type formed in a step lower region; and a second transistor having a second linewidth greater than a linewidth of the first transistor in either the one-conductivity type semiconductor region or the opposite-conductivity type semiconductor region formed in a step higher region.

Meanwhile, a method of manufacturing the same comprises: a step of forming a first gate oxide film on either a one-conductivity type semiconductor region or an opposite-conductivity type semiconductor region formed in a step lower region; a step of forming a second gate oxide film on either the one-conductivity type semiconductor region or the opposite-conductivity type semiconductor region formed in a step higher region; a step of forming a conductor film on the first and second oxide films and, thereafter, patterning the conductor film to form a first gate electrode and a second gate electrode greater in linewidth than the first gate electrode; a step of forming a first source/drain region in the vicinity of the first gate electrode to have an opposite conductivity type to the semiconductor region forming the gate electrode thereby forming a first transistor; and a step of forming a second source/drain region in the vicinity of the second gate electrode to have an opposite conductivity type to the semiconductor region forming the gate electrode thereby forming a second transistor.

The first transistor constitutes a MOS transistor of normal withstand voltage (hereinafter, a normal-voltage MOS transistor) and the second MOS transistor constitutes a MOS transistor of high withstand voltage (hereinafter, a high-voltage MOS transistor).

Meanwhile, the step of forming one-conductivity type and opposite-conductivity type semiconductor regions in the one-conductivity type substrate utilizes a LOCOS technique thereby forming a step on the substrate.

Furthermore, the step of patterning the conductor film to form first and second gate electrodes includes patterning the organic film through the resist film as a mask after forming an organic film and resist film on the conductor film and, further, patterning the conductor film through the resist film and organic film as a mask.

Due to this, in the case that there is a step on the substrate, in the step lower region is formed a first gate electrode smaller in linewidth than the second gate electrode formed in the step higher region, making possible to cope with a precise gate electrode less in working margin.

BRIEF DESCRIPTION OF THE DRAWINGS

FIGS. 17A and 17B are sectional views showing a method of manufacturing a semiconductor device of the second embodiment of the invention;

DETAILED DESCRIPTION OF THE PREFERRED EMBODIMENTS

With reference to the drawings, explanation will be now made on a semiconductor device and method of manufacturing the semiconductor device of the present invention.

Herein, the invention has a feature that, where a step is provided on a surface of a semiconductor substrate, a first gate electrode smaller in linewidth than a second gate electrode formed in a step higher region is arranged in a step lower region. Namely, this suppresses linewidth variation in the gate electrode formed in the step lower region and the gate electrode formed in the step higher region caused due to linewidth variation by the standing wave or the thickness difference of the organic BARC applied for preventing the occurrence of halation at the step. For this reason, the present embodiment arranges a gate electrode in the step lower region smaller in linewidth than a gate electrode in the step higher region.

The invention will be explained below on the case to form a first gate electrode smaller in linewidth (e.g. 0.35 µm: for 3 V logic) in a step lower region and a second gate electrode greater in linewidth (e.g. 5 µm: for high power source having 30 V withstand voltage) in a step higher region.

Figure 1:
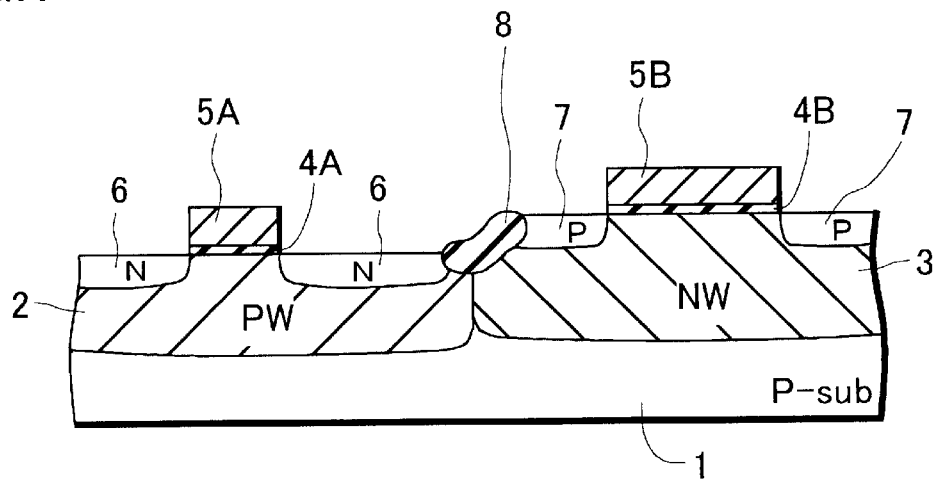
FIG. 1 is a sectional view showing a method of manufacturing a semiconductor device of a first embodiment of the present invention.

In FIG. 1, numeral 1 denotes a semiconductor substrate (P-sub) of one conductor type, e.g. P type, wherein a P type well (PW) 2 and an N type well 3 are formed in the substrate 1. A first gate electrode 5A is formed on the P type well 2 through a first gate oxide film 4A. In the vicinity of the gate electrode 5A, first (N type) source/drain regions 6 are formed to constitute a first (N-channel type) MOS transistor. A second gate electrode 5B is formed on the N type well 3 through a second gate oxide film 4B. In the vicinity of the gate electrode 5B, second (P type) source/drain regions 7 are formed to constitute a second (P-channel type) MOS transistor. Meanwhile, numeral 8 denotes a device isolation film.

Figure 2:
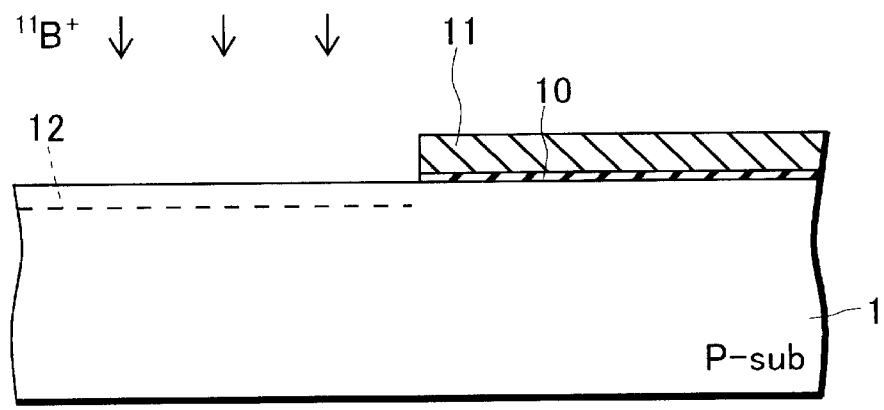
FIG. 2 is a sectional view showing a method of manufacturing a semiconductor device of the first embodiment of the invention.

In FIG. 2, a pad oxide film 10 and a silicon nitride film 11 are formed on a predetermined region (region for an N type well 3) of the semiconductor substrate 1 (P-sub). Then, using the pad oxide film 10 and silicon nitride film 11 as a mask, boron ion ($^{11}B^+$), for example, is ion-implanted to a surface of the substrate at an acceleration voltage of approximately 80 keV and a dose of $8\times10^{12}/cm^2$, thereby forming an ion-implant region 12.

Figure 3:
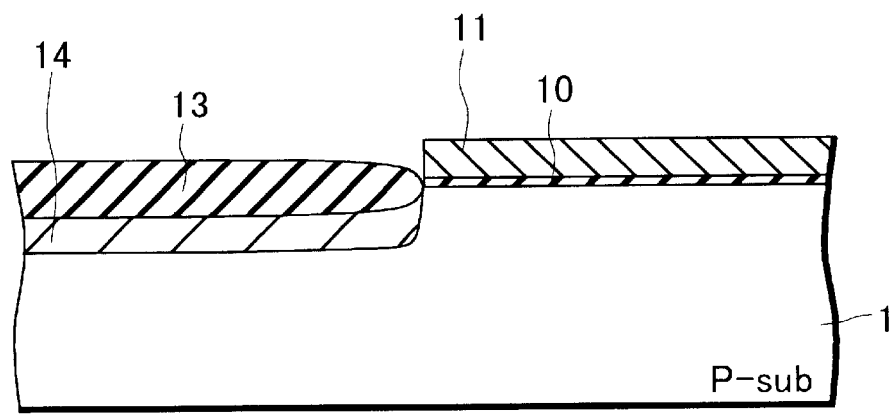
FIG. 3 is a sectional view showing a method of manufacturing a semiconductor device of the first embodiment of the invention.

Thereafter, as shown in FIG. 3, the silicon nitride film 11 is used as a mask to oxidize the substrate surface by the LOCOS technique thereby forming a LOCOS film 13. At this time, the boron ion implanted in the region beneath the LOCOS film 13 is diffused toward the inward of the substrate, thus forming a P type region 14.

Figure 4:
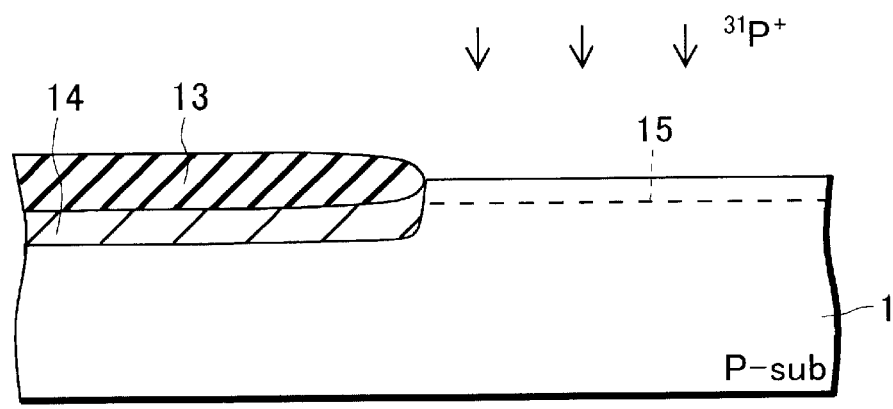
FIG. 4 is a sectional view showing a method of manufacturing a semiconductor device of the first embodiment of the invention.

Then, as shown in FIG. 4, the pad oxide film 10 and silicon nitride film 11 is removed away. Thereafter, the LOCOS film 13 is used as a mask to ion-implant phosphorus ion ($^{31}P^+$) to the substrate surface at an acceleration voltage of 80 keV and a dose of $9\times10^{12}/cm^2$, thereby forming an ion-implant region 15.

Figure 5:
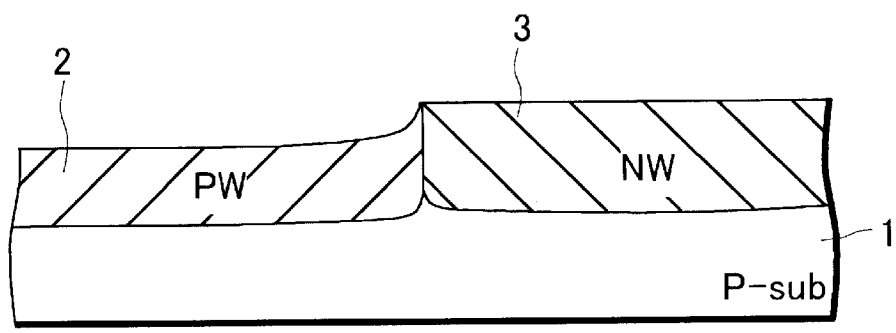
FIG. 5 is a sectional view showing a method of manufacturing a semiconductor device of the first embodiment of the invention.

Subsequently, as shown in FIG. 5, the LOCOS film 13 is removed. Thereafter, the impurity ions implanted in the substrate are thermally diffused to form a P type well 2 and an N type well 3.

Figure 6:
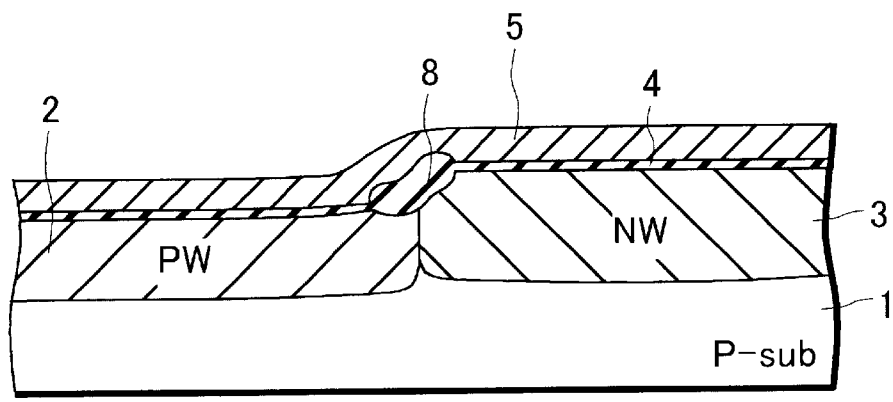
FIG. 6 is a sectional view showing a method of manufacturing a semiconductor device of the first embodiment of the invention.

Subsequently, as shown in FIG. 6, a device isolation film 8 is formed at the border on the P type well 2 and N type well 3. Thereafter, a gate oxide film 4 is formed in a region other than the device isolation film 8, and a conductor film 5 (e.g. a polysilicon film or a polycide film having a lamination of polysilicon and tungsten siliside films (WSix film)) is formed on the gate oxide film 4.

Figure 7:
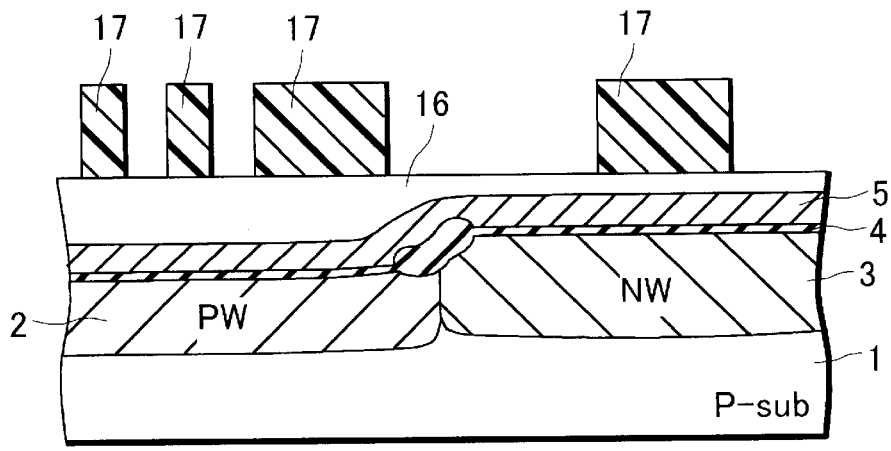
FIG. 7 is a sectional view showing a method of manufacturing a semiconductor device of the first embodiment of the invention.

Then, as shown in FIG. 7, organic BARC is applied over the conductor film 5 to form an organic thin film 16, on which a resist film 17 is formed. At this time, due to the spin coating of the organic BARC, the thickness of organic thin film 16 has a thickness greater in the step lower region than in the step higher region.

Figure 8:
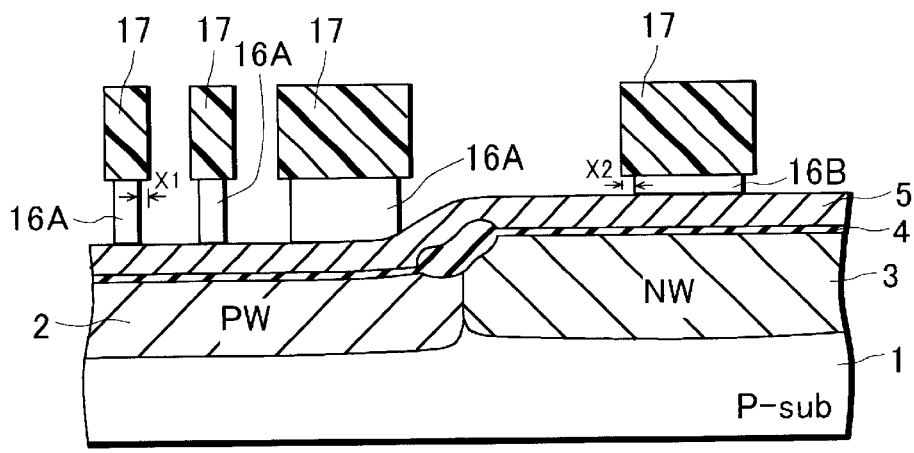
FIG. 8 is a sectional view showing a method of manufacturing a semiconductor device of the first embodiment of the invention.

As shown in FIG. 8, using the resist film 17 as a mask, the conductor film 5 is patterned to form a first gate electrode 5A and a second gate electrode 5B.

Namely, the organic thin film 16 at the beneath of the resist film 17 is first patterned, and the conductor film 5 is then patterned through a mask of the resist film 17 and organic thin film 16 to form a first gate electrode 5A and a second gate electrode 5B (see FIG. 1). At this time, because of the difference in thickness of the organic thin film 16, the organic thin film 16B of the step higher region is removed more than the organic thin film 16A of the step lower region to have a decreased linewidth. However, even where the removal amount $X_1$ of the organic thin film 16A in the step lower region is 0.02 µm and the removal amount $X_2$ of the organic thin film 16B in the step higher region is 0.05 µm, the first gate electrode 5B formed on the step higher region is 5 µm that is comparatively great in design. Thus, there is less affection due to such variation in linewidth.

Accordingly, by patterning the conductor film 5 using the resist film 17 and organic thin film 16A, 16B as a mask, a first gate electrode 5A and a second gate electrode 5B are formed with less affection of the linewidth variation.

Thereafter, as shown in FIG. 1, an N type impurity (e.g. phosphorus ion) is ion-implanted to the vicinity of the first gate electrode 5A to form N type source/drain regions 6. Similarly, a P type impurity (e.g. boron ion) is ion-implanted to the vicinity of the second gate electrode 5B to form P type source/drain regions 7. Although explanatory showing is omitted, an interlayer insulating film is formed over the entire surface. By forming a metal interconnection having contacts to the source/drain regions 6, 7, a semiconductor device is completed which is mounted with a precise normal-voltage MOS transistor for normal withstand voltage (e.g. for 3 V logic: 0.35 µm) and a high-voltage MOS transistor for high withstand voltage (e.g. high power source: 5 µm) together.

Incidentally, the explanation was as if the gate oxide films 4A, 4B were formed in the same film thickness respectively for the normal-voltage MOS transistor and the high-voltage MOS transistor, for the convenience of explanation. However, concerning the actual film thickness of the gate oxide films 4A, 4B, the gate oxide film 4A requires a film thickness of approximately 7 nm for a normal-voltage MOS transistor, e.g. of approximately 3 V while the gate oxide film 4B requires a film thickness of approximately 80 nm for a high-voltage MOS transistor, e.g. of approximately 30 V. These are formed in the process independent of each other. Similarly, the source/drain regions 6, 7 in actual are different in structure in accordance with a transistor characteristic in various kinds, i.e. so-called an LDD structure, a DDD structure or a single drain structure as was shown.

As explained in the above, the invention can reduce the variation in gate electrode linewidth despite having a step on the semiconductor substrate.

Also, there is a merit to increase the freedom in adjusting the gate electrode linewidth. Furthermore, it is facilitated to mount together a precise MOS transistor and a high-power MOS transistor.

Explanation is now made on a second embodiment that the invention is applied to a semiconductor device mounted with various MOS transistors to constitute a display driver such as a liquid-crystal driver and an electroluminescence driver, while referring to the drawings.

Figure 18A:
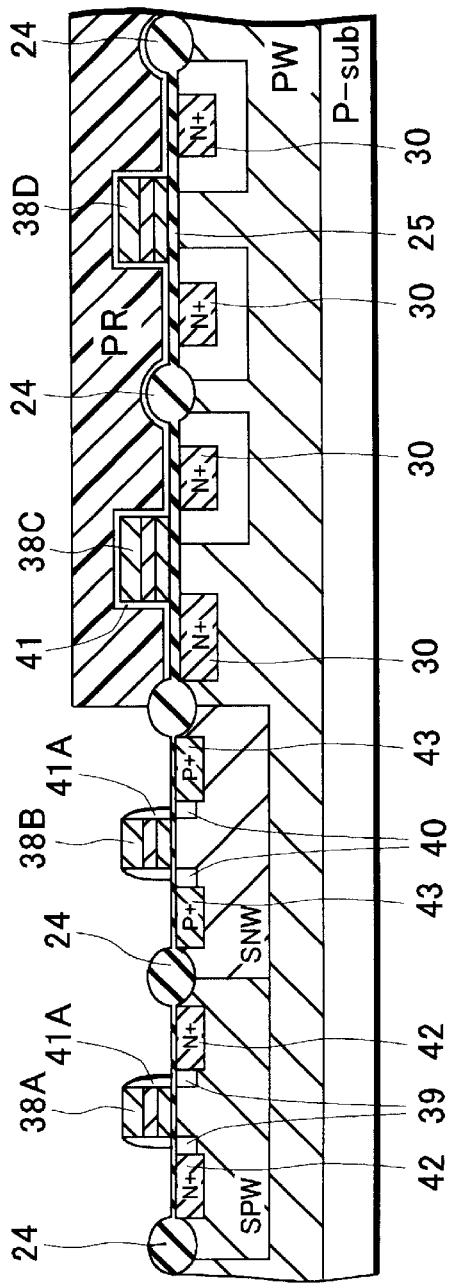
FIGS. 18A and 18B are sectional views showing a method of manufacturing a semiconductor device of the second embodiment of the invention.
Figure 18B:
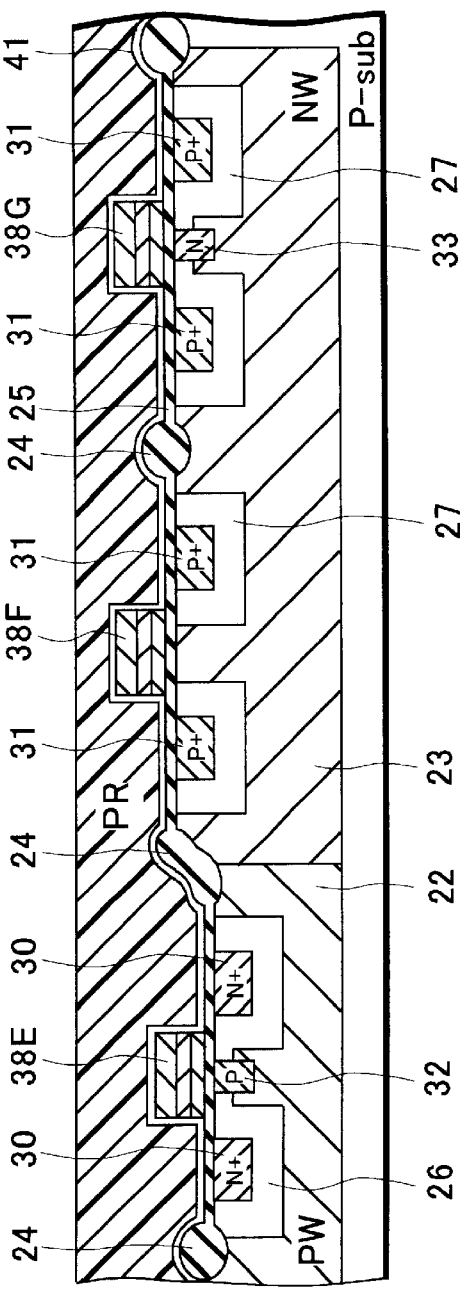
Figure 19:
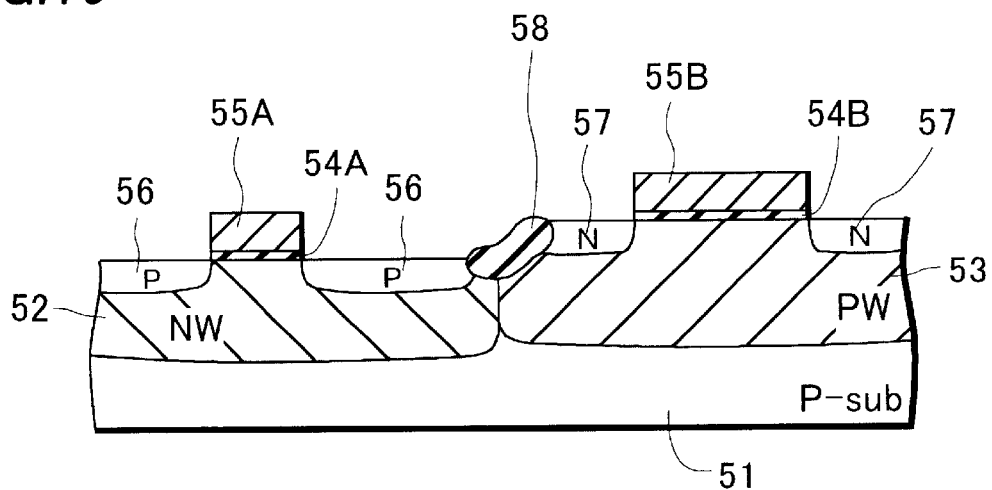
FIG. 19 is a sectional view showing a method of manufacturing a conventional semiconductor device.
Figure 20:
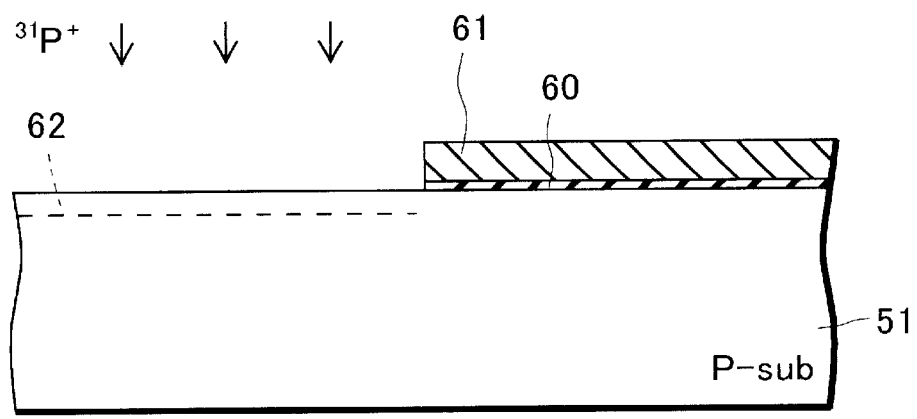
FIG. 20 is a sectional view showing a method of manufacturing a conventional semiconductor device.
Figure 21:
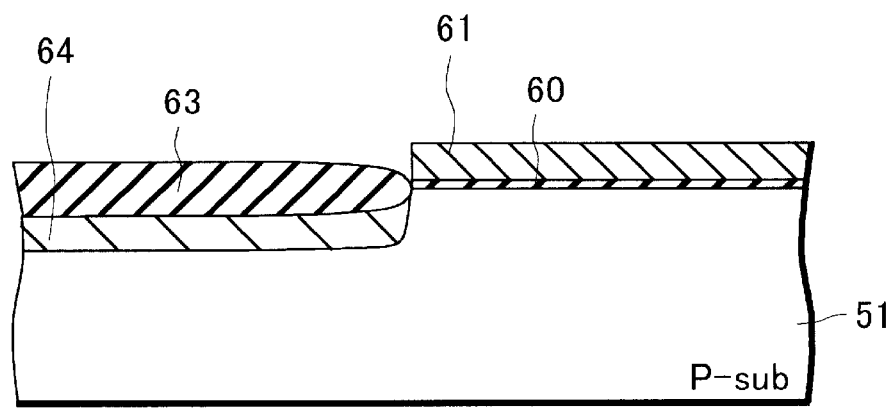
FIG. 21 is a sectional view showing a method of manufacturing a conventional semiconductor device.
Figure 22:
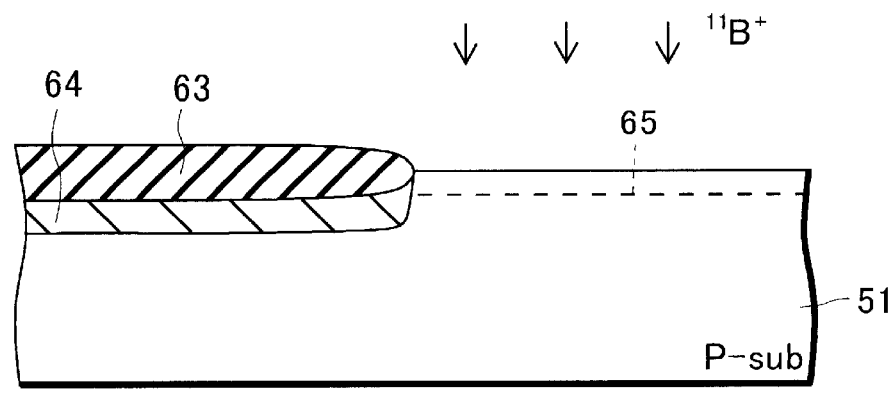
FIG. 22 is a sectional view showing a method of manufacturing a conventional semiconductor device.
Figure 23:
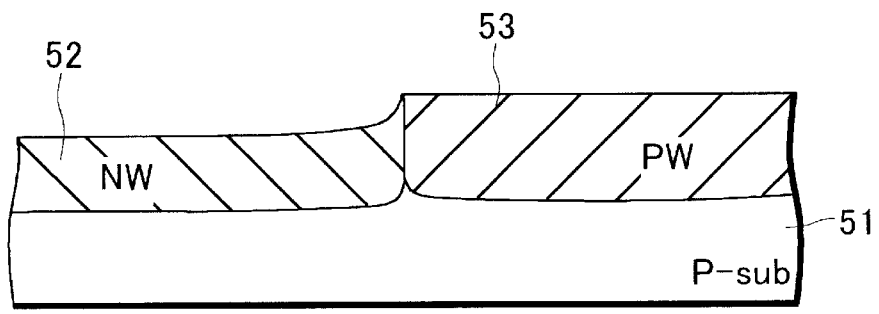
FIG. 23 is a sectional view showing a method of manufacturing a conventional semiconductor device.
Figure 24:
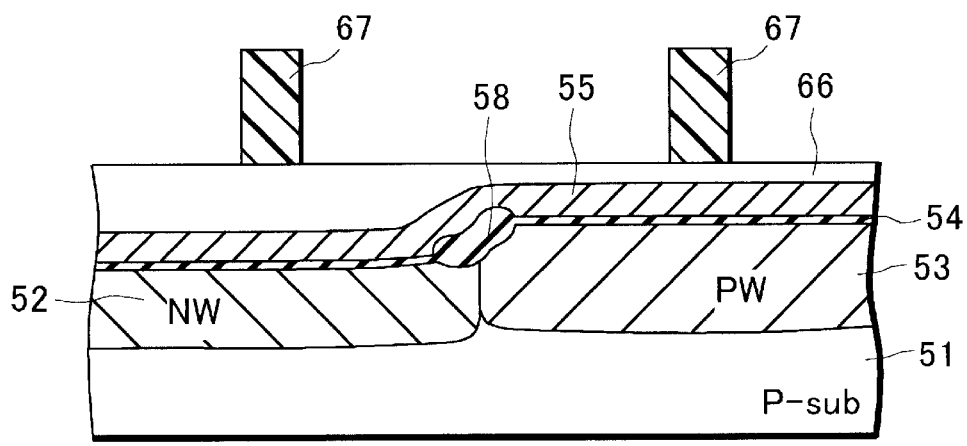
FIG. 24 is a sectional view showing a method of manufacturing a conventional semiconductor device.
Figure 25:
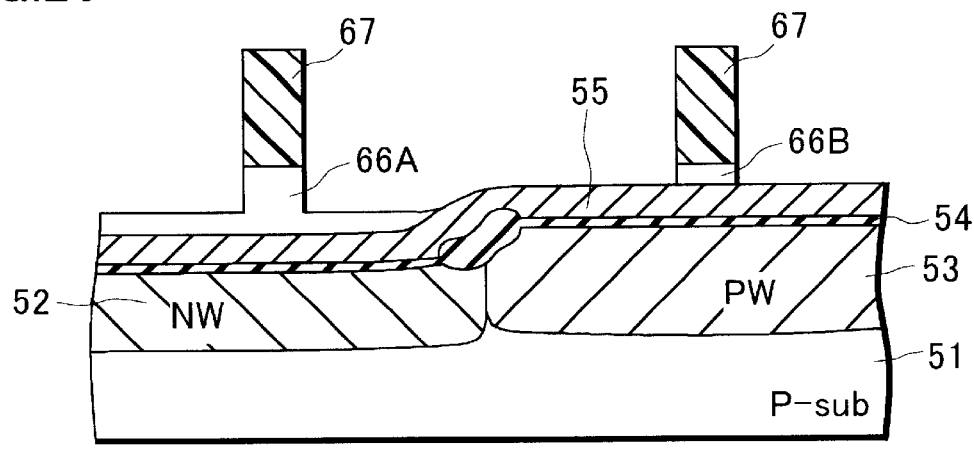
FIG. 25 is a sectional view showing a method of manufacturing a conventional semiconductor device.
Figure 26:
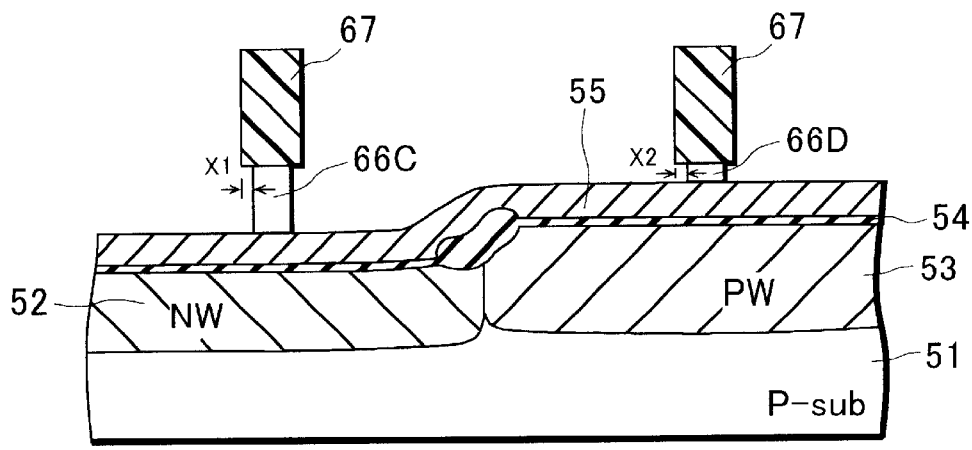
FIG. 26 is a sectional view showing a method of manufacturing a conventional semiconductor device.

The display driver is configured with, as viewed from the left in FIG. 18A, logic N-channel MOS and P-channel MOS transistors (e.g. on 3 V), an N-channel MOS transistor (e.g. on 30 V) for a level shifter and an N-channel high-voltage MOS transistor (e.g. on 30 V) and, as viewed from the left in FIG. 18B, an N-channel high-voltage MOS transistor (e.g. on 30 V) reduced in on resistance, a P-channel high-voltage MOS transistor (e.g. on 30 V) and a P-channel high-voltage MOS transistor (e.g. on 30 V) reduced in on-resistance. Note that, in the below explanation, the MOS high-voltage transistor reduced in on-resistance is referred to as an SLED (Slit channel by counter doping with extended shallow drain) MOS transistor in order to differentiate between the high-voltage MOS transistor and the high-voltage MOS transistor reduced in on-voltage, for the sake of explanation.

In the semiconductor device mounted with various MOS transistors constituting such a display driver, as shown in FIGS. 18A and 18B, an N type well region 23 forming the P-channel high-voltage transistor and the P-channel high-voltage SLEDMOS transistor reduced in on-resistance is configured in a step higher region, while a P type well region 22 forming the other MOS transistors is configured in a step lower region. In other words, structuring is made to arrange the precise logic (e.g. 3V) N-channel MOS and P-channel MOS transistors in the step lower region.

In also this case, by arranging at least the precise logic (e.g. 3V: 0.35 µm) N-channel MOS and the P-channel MOS transistors in the step lower region of the semiconductor substrate, the linewidth variation can be reduced in the gate electrodes.

Explanation is made below on a method of manufacturing a semiconductor device as described in the above. Note that, in order to avoid duplicated explanation, the explanation is made while referring to the figures explained in the first embodiment.

Figure 9A:
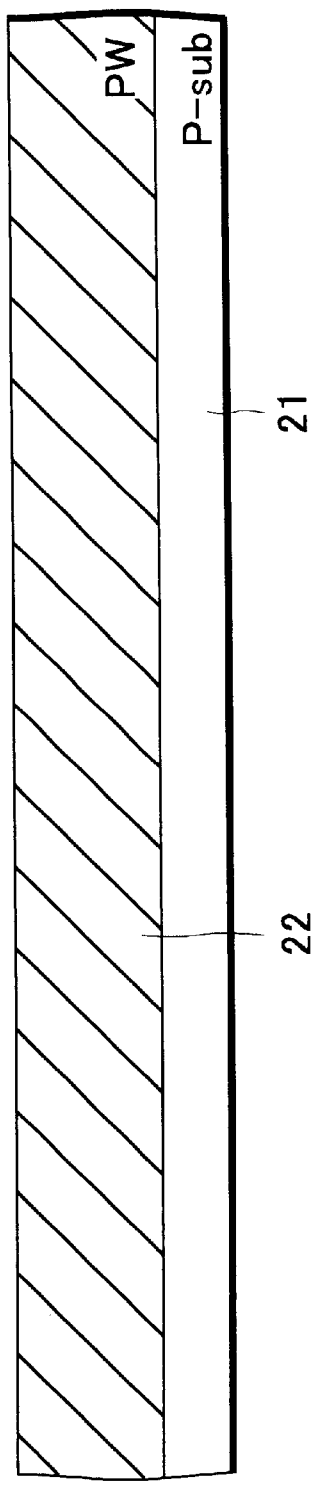
FIGS. 9A and 9B are sectional views showing a method of manufacturing a semiconductor device of a second embodiment of the present invention.
Figure 9B:
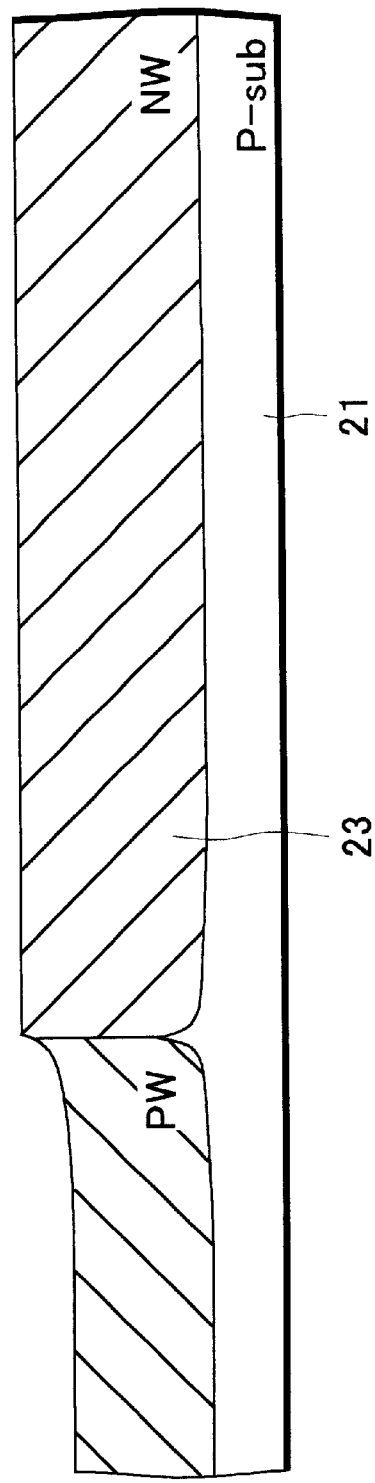

In FIGS. 9A and 9B, in order to define a region for forming various MOS transistors, a P type well (PW) 22 and an N type well (NW) 23 are first formed, e.g. in a p type semiconductor substrate (P-sub) (from now on, see FIGS. 2 to 5).

At first, as shown in FIG. 2, a pad oxide film 10 and a silicon nitride film 11 are formed on the well region of the semiconductor substrate 21. The pad oxide film 10 and silicon nitride film 11 is used as a mask to ion-implant boron ion, for example, at an acceleration voltage of approximately 80 keV and a dose of $8\times10^{12}/cm^2$, thereby forming an ion-implant region 12. Thereafter, as shown in FIG. 3, the silicon nitride film 11 is used as a mask to oxidize the substrate surface by the LOCOS technique, thereby forming a LOCOS film 13. At this time, the boron ion implanted in a region beneath the LOCOS film 13 is diffused toward the inward of the substrate to form a P type region 14.

Next, the pad oxide film 10 and the silicon nitride film 11 are removed as shown in FIG. 4. Thereafter, the An LOCOS film 13 is used as a mask to ion-implant phosphorus ion to the substrate surface, at an acceleration voltage of approximately 80 keV and a dose of $9\times10^{12}/cm^2$, thereby forming an ion-implant region 15.

Then, the LOCOS film 13 is removed away as shown in FIG. 5. Thereafter, the impurity ions implanted in the substrate 1 are thermally diffused to form a P type well and N type well. Thus, as shown in FIGS. 9A and 9B, the P type well 22 formed in the substrate 21 is arranged in a step lower region while the N type well is arranged in a step higher region.

Figure 10A:
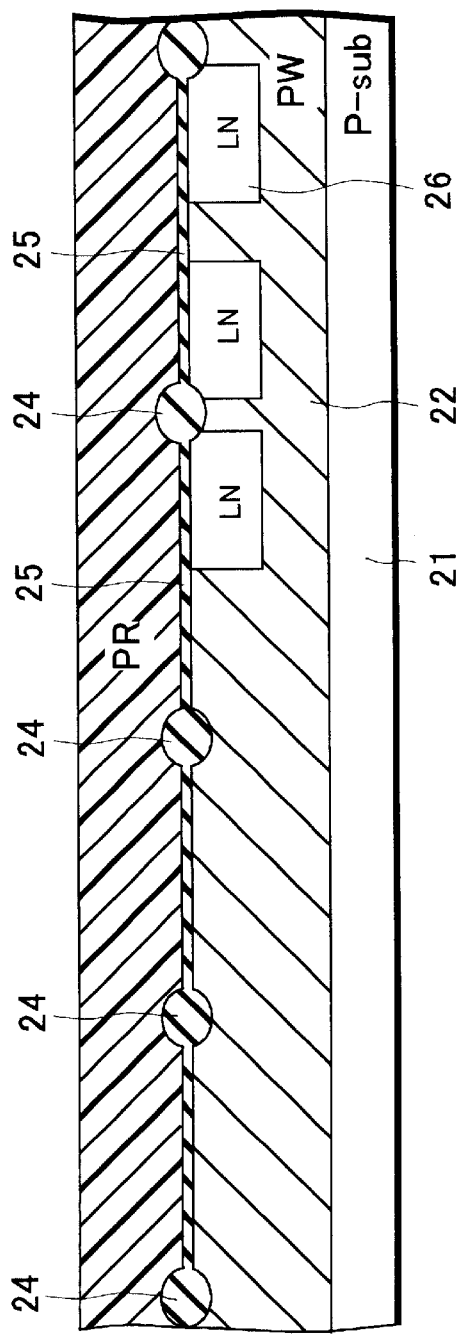
FIGS. 10A and 10B are sectional views showing a method of manufacturing a semiconductor device of the second embodiment of the invention.
Figure 10B:
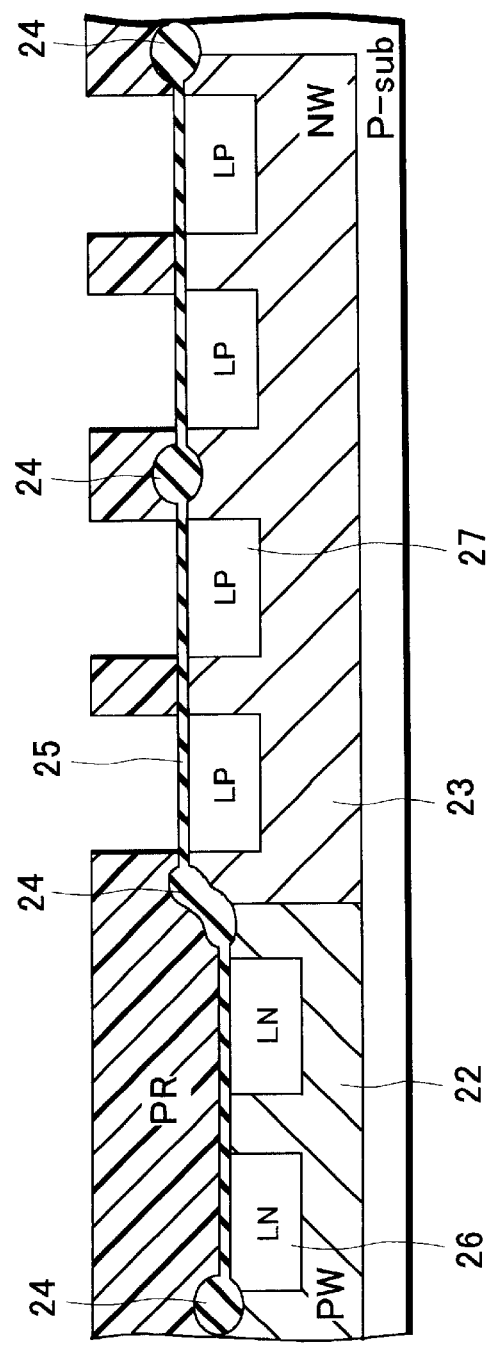

Next, in FIGS. 10A and 10B, a device isolation film 24 is formed to an approximately 500 nm by the LOCOS process in order for device isolation based on the MOS transistor. A thick gate oxide film 25 for withstanding high voltage is formed by thermal oxidation in a thickness of approximately 80 nm on an active region excepting the device isolation region.

Subsequently, the resist film is used as a mask to form first low-concentration N type and P type source/drain regions (hereinafter, referred to as LN region 26, LP region 27). Namely, in a state covering the region of other than an LN region by a not-shown resist film, phosphorus ion, for example, is first ion-implanted to the substrate surface layer at an acceleration voltage of 120 keV and a dose of $8\times10^{12}/cm^2$ thereby forming an LN region 26. Thereafter, in a state covering the region of other than an LP region by a resist film (PR), boron ion, for example, is ion-implanted to the substrate surface layer at an acceleration voltage of 120 keV and a dose of $8.5\times10^{12}/cm^2$ thereby forming an LP region 27. Note that, in actual, the implanted ionic species will be thermally diffused into a LN region 26 and LP region 27 through an anneal process as a later process (e.g. in an $N_2$ atmosphere at 1100° C. for 2 hours).

Figure 11A:
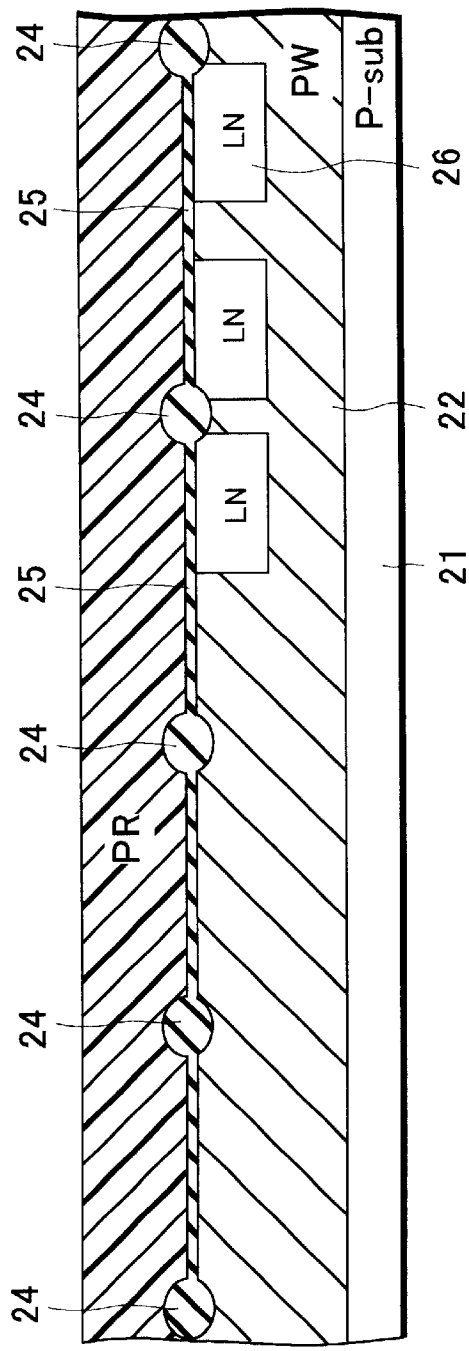
FIGS. 11A and 11B are sectional views showing a method of manufacturing a semiconductor device of the second embodiment of the invention.
Figure 11B:
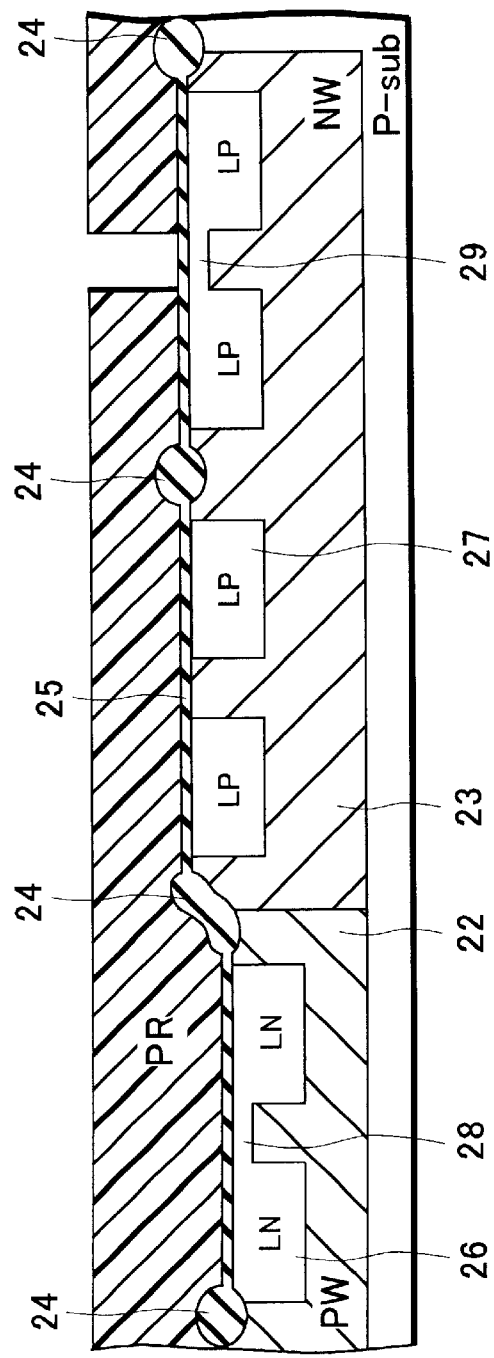

Subsequently, in FIGS. 11A and 11B, using as a mask a resist film at between the LN regions 26 and the LP regions 27 forming the regions for P-channel and N-channel SLED-MOS transistors, second low-concentration N type and P type source/drain regions (hereinafter, referred to as SLN region 28 and SLP region 29) are formed. Namely, in a state covering the region other than the region for an SLN region by a not-shown resist mask, phosphorus ion, for example, is first ion-implanted to the substrate surface layer at an acceleration voltage of 120 keV and a dose of $1.5\times10^{12}/cm^2$ to form an SLN region 28 continuing the LN regions 26. Then, in a state covering the other region of the SLP region by a resist film (PR), boron difluoride ($^{49}BF_2^+$), for example, is ion-implanted to the substrate surface region at an acceleration voltage of 140 keV and a dose of $2.5\times10^{12}/cm^2$ to form an SLP region 29 continuing the LP regions 27. Note that the LN region 26 and the SLN region 28 or the LP region 27 and the SLP region 29 are set nearly equal in impurity concentration or higher in either one.

Figure 12A:
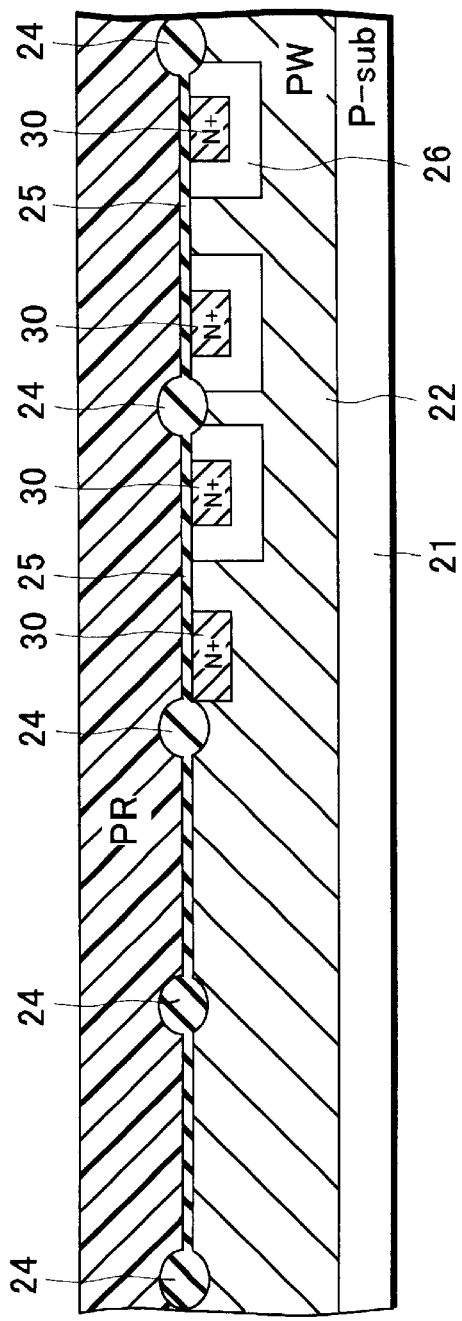
FIGS. 12A and 12B are sectional views showing a method of manufacturing a semiconductor device of the second embodiment of the invention.
Figure 12B:
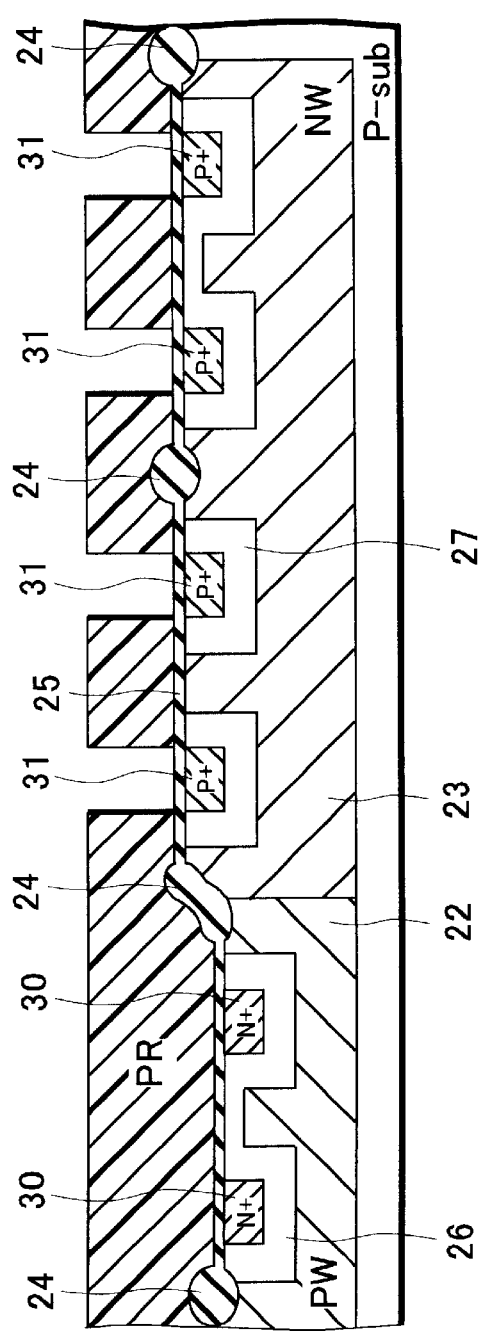

Furthermore, in FIGS. 12A and 12B, a resist film is used as a mask to form high-concentration N type and P type source/drain regions (hereinafter, referred to as $N^+$ region 30, $P^+$ region 31). Namely, in a state covering the other region than a region for an $N^+$ region by a not-shown resist film, phosphorus ion, for example, is first ion-implanted to the substrate surface layer at an acceleration voltage of 80 keV and a dose of $2\times10^{15}/cm^2$ thereby forming an $N^+$ region 30. Thereafter, in a state covering the other region than a region for a $P^+$ region by a resist film (PR), boron difluoride ion, for example, is ion-implanted to the substrate surface layer at an acceleration voltage of 140 keV and a dose of $2\times10^{15}/cm^2$ thereby forming a $P^+$ region 31.

Figure 13A:
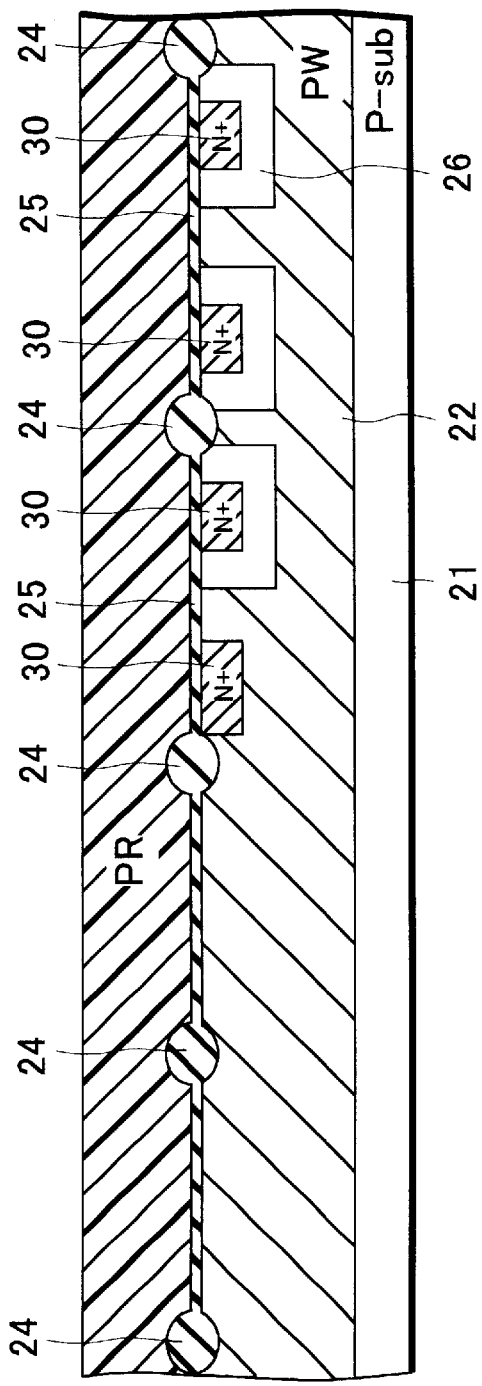
FIGS. 13A and 13B are sectional views showing a method of manufacturing a semiconductor device of the second embodiment of the invention.
Figure 13B:
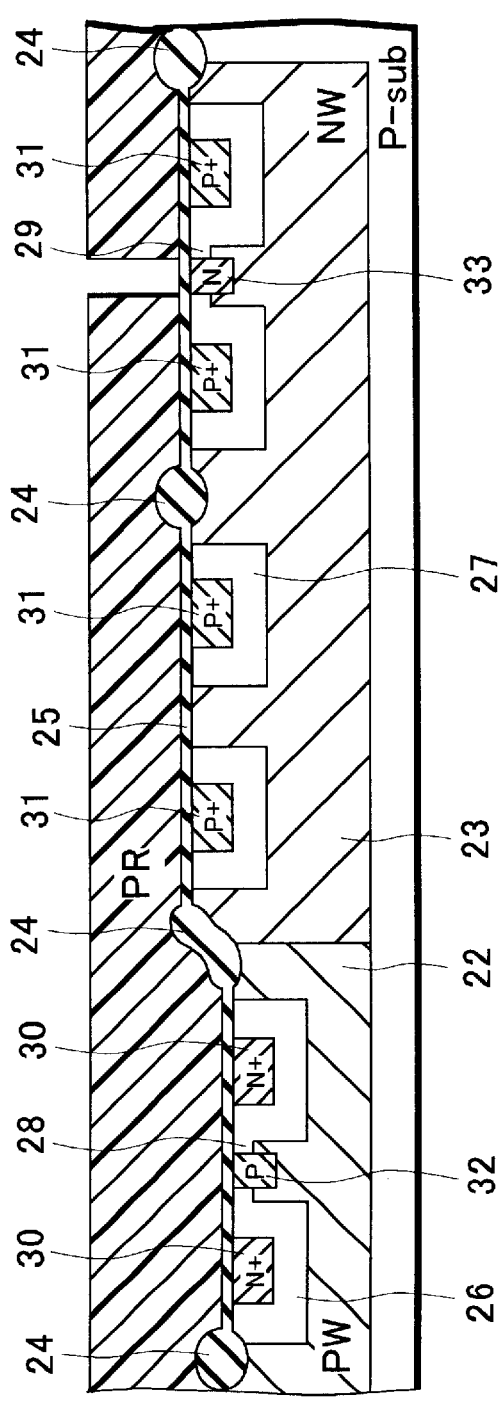

Next, in FIGS. 13A and 13B, using as a mask a resist film having an opening diameter smaller than the mask opening diameter (see FIG. 11) for forming the SLN region 28 and SLP region 29, opposite-conductivity type impurities are ion-implanted to a central area of the SLN region 28 continuing the LN regions 26 and to a central area of the SLP region 29 continuing the LP regions 27, thereby forming a P type body region 32 and an N type body region 33 to respectively separate the SLN region 28 and the SLP region 29. Namely, in a state covering the other region than the region for a P type region by a not-shown resist film, boron difluoride ion, for example, is first ion-implanted to the substrate surface layer at an acceleration voltage of 120 keV and a dose of $5\times10^{12}/cm^2$ thereby forming a P type body region 32. Thereafter, in a state covering the other region than the region for an N type region by a resist film (PR), phosphorus ion, for example, is ion-implanted to the substrate surface layer at an acceleration voltage of 190 keV and a dose of $5\times10^{12}/cm^2$ thereby forming an N type body region 33. Note that the operation processes concerning ion implant shown in FIGS. 11A to 13B may be properly changed in order. The P type body region 32 and the N type body region 33 each will be constituted with a channel in a surface region thereof.

Figure 14A:
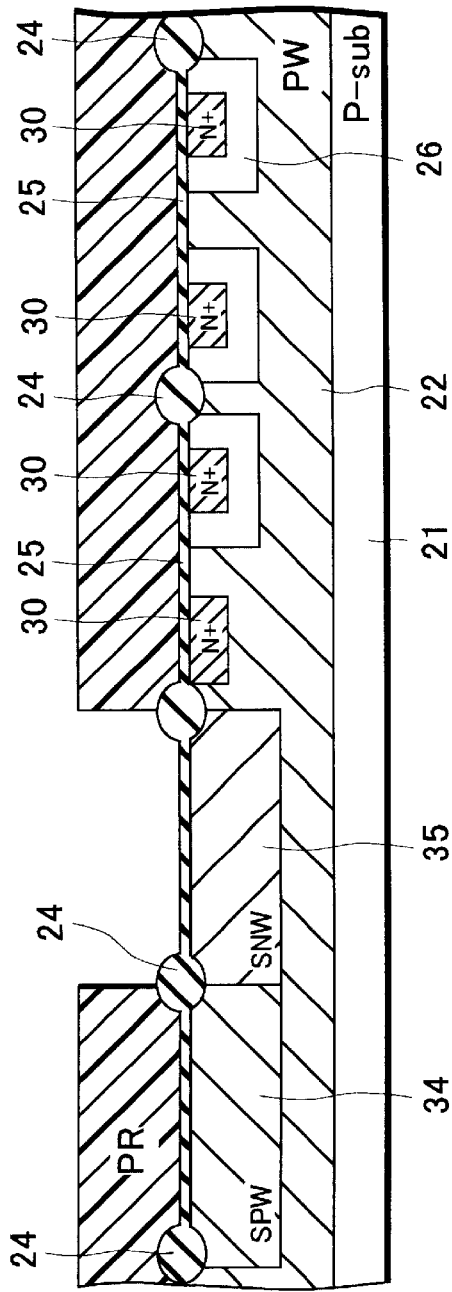
FIGS. 14A and 14B are sectional views showing a method of manufacturing a semiconductor device of the second embodiment of the invention.
Figure 14B:
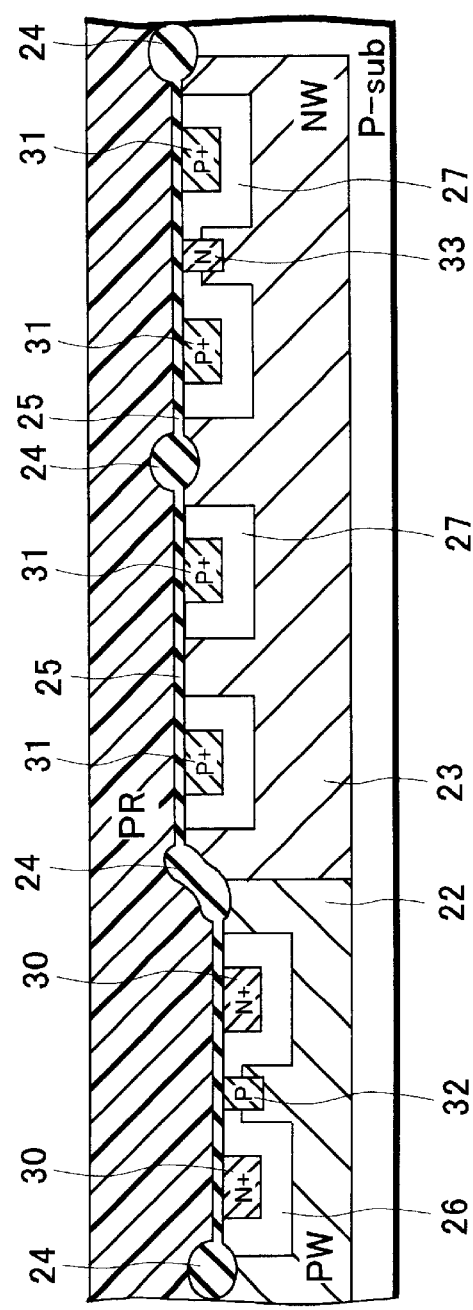

Furthermore, in FIGS. 14A and 14B, a second P type well (SPW) 34 and a second N type well (SNW) 35 are formed in the substrate (P type well 22) at a region for a precise N-channel and P-channel MOS normal-voltage transistors.

Namely, using a not-shown resist film having an opening in the region for an N-channel normal-voltage MOS transistor as a mask, boron ion, for example, is ion-implanted to the P type well 22 at an acceleration voltage of approximately 190 keV and a dose of (first implant condition) $1.5\times10^{13}/cm^2$. Thereafter, boron ion is again ion-implanted at an acceleration voltage of approximately 50 keV and a dose of (second implant condition) $2.6\times10^{12}/cm^2$, thus forming a second P type well 34. Also, using a resist film (PR) having an opening in the region for a P-channel normal-voltage MOS transistor as a mask, phosphorous ion, for example, is ion-implanted to the P type well 22 at an acceleration voltage of approximately 380 keV and a dose of $1.5\times10^{13}/cm^2$, thereby forming a second N type well 35. Note that, where a high-acceleration voltage generating apparatus having nearly 380 keV is not available, it is satisfactory to use a double charge scheme for ion-implant two-valence phosphorus ion at an acceleration voltage of approximately 190 keV and a dose of $1.5\times10^{13}/cm^2$. Subsequently, phosphorus ion is ion-implanted at an acceleration voltage of approximately 140 keV and a dose of $4.0\times10^{12}/cm^2$.

Figure 15A:
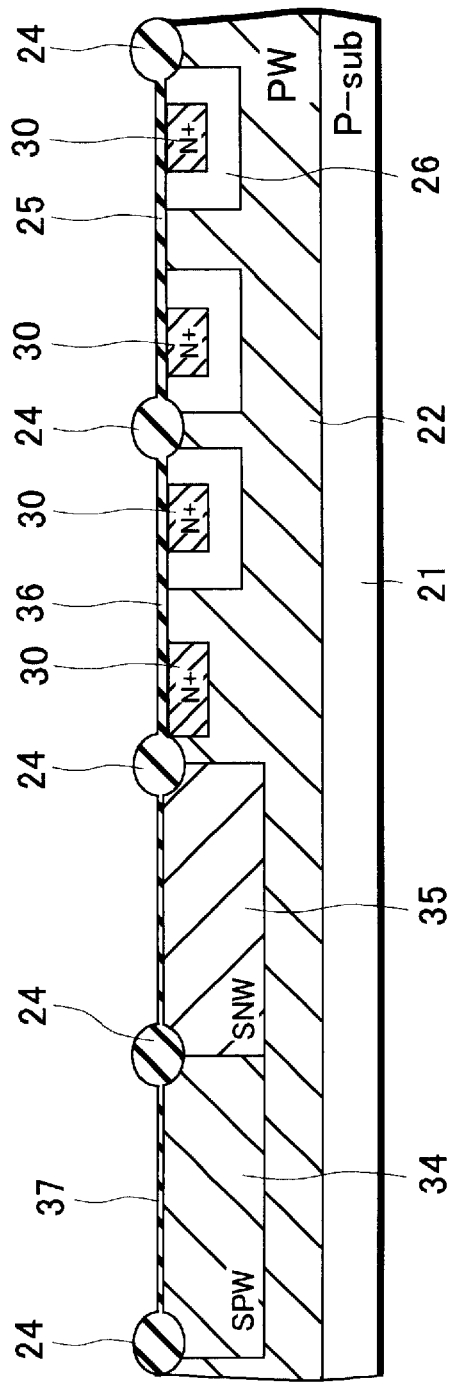
FIGS. 15A and 15B are sectional views showing a method of manufacturing a semiconductor device of the second embodiment of the invention.
Figure 15B:
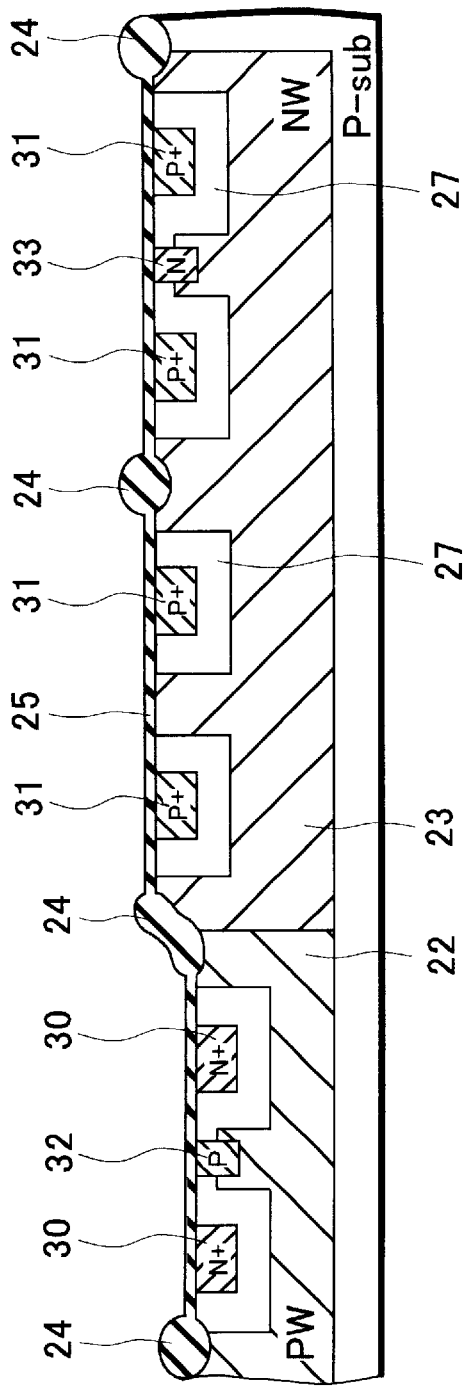

Next, removed is the oxide film 25 from the regions for N-channel and P-channel normal-voltage MOS transistors and for a level-shifter N-channel MOS transistor. Thereafter, as shown in FIGS. 15A and 15B, a gate oxide film having a desired film thickness is newly formed on the above region.

Namely, a gate oxide film 36 is formed on the entire surface by thermal oxidation to approximately 14 nm (approximately 7 nm at this stage, but the film thickness will increase upon forming a gate oxide film for normal voltage referred later) for a level-shifter N-channel MOS transistor. Subsequently, after removing the gate oxide film 36 for a level-shifter N-channel MOS transistor formed on the region for N-channel and P-channel normal-voltage MOS transistors, a thin gate oxide film 37 (approximately 7 nm) for normal voltage is formed on this region by thermal oxidation.

Figure 16A:
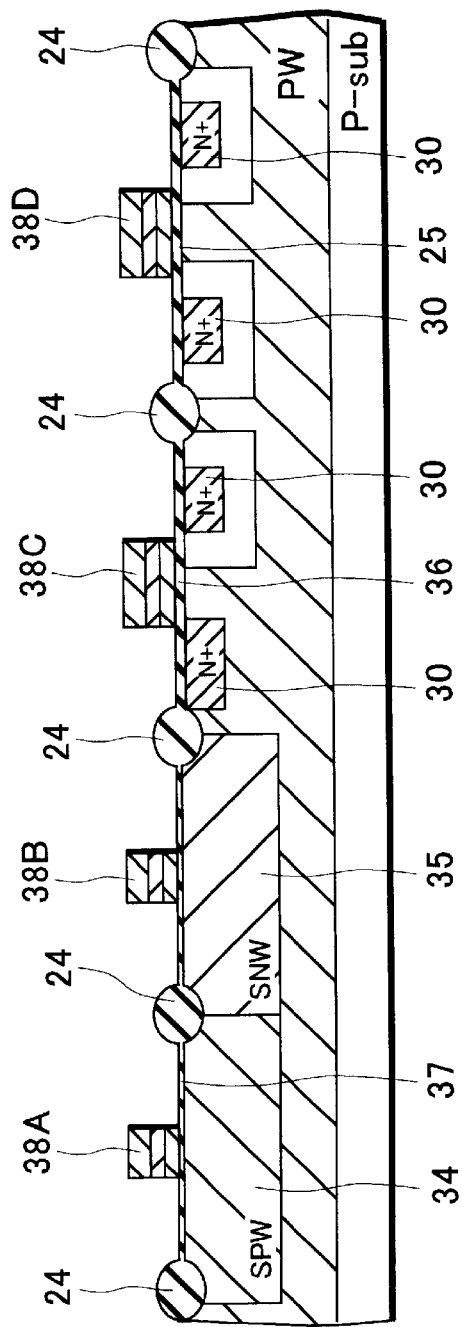
FIGS. 16A and 16B are sectional views showing a method of manufacturing a semiconductor device of the second embodiment of the invention.
Figure 16B:
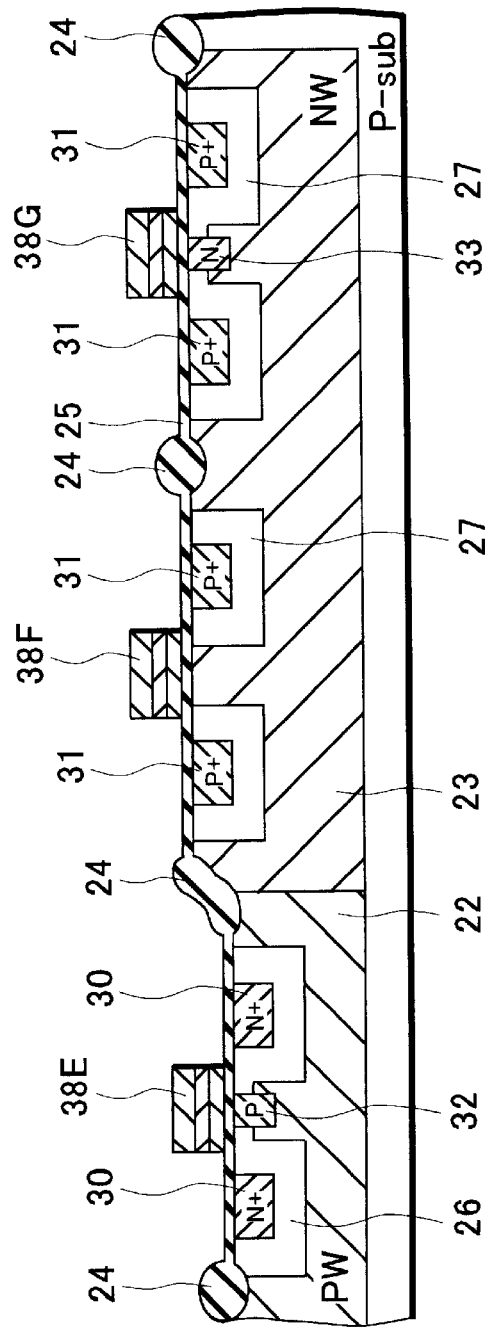

Subsequently, in FIGS. 16A and 16B, a polysilicon film having approximately 100 nm is formed over the entire surface. The polysilicon film is thermally diffused by $POCl_3$ as a thermal-diffusion source thus being made conductive. Thereafter, a tungsten silicide film having approximately 100 nm are formed on the polysilicon film, and further an $SiO_2$ film having approximately 150 nm thereon. Using a not-shown resist film, patterning is made to form gate electrodes 38A, 38B, 38C, 38D, 38E, 38F, 38G for MOS transistors. Note that the $SiO_2$ film serves as a hard mask during the patterning.

Herein, when patterning the gate electrodes, a conductor film 5 is formed over the entire surface through the gate oxide films 25, 36, 37 and, thereafter, organic BARC is applied thereon to form an organic thin film 16. At this time, because the organic BARC is spin coated, the organic thin film 16 is increased in film thickness in a step lower region as compared to that in the step higher region (see FIG. 7).

Then, using the resist film 17 formed on the organic thin film 16 as a mask, the conductor film 5 is patterned to form gate electrodes (38A, 38B, 38C, 38D, 38E, 38F, 38G) (see FIG. 8).

At this time, by the thick difference in the organic thin film 16, the organic thin film 16 on the step higher region is removed more than the organic thin film 16 on the step lower region, thus being reduced in linewidth. However, in this embodiment, because the gate electrode 38E, 38G is formed comparatively large in linewidth on design, i.e. 5 $\mu$m, for a high-voltage P-channel MOS transistor and high-voltage P-channel SLEDMOS transistor reduced in on-resistance, the affection of linewidth variation is reduced.

Accordingly, by patterning the conductor film 5 with using a mask of the resist film 17 and organic thin film 16, gate electrodes 38A, 38B, 38C, 38D, 38E, 38F, 38G are formed reduced in the affection of linewidth variation.

Subsequently, in FIGS. 17A and 17B, low-concentration source/drain regions are formed for normal-voltage N-channel and P-channel MOS transistors.

Namely, using as a mask a not-shown resist film covering the other region than the region for low-concentration source/drain regions for a normal-voltage N-channel MOS transistor, phosphorus ion, for example, is ion-implanted at an acceleration voltage of approximately 20 keV and a dose of $6.2 \times 10^{13}/cm^2$ to form low-concentration $N^-$ type source/drain regions 39. Meanwhile, using as a mask a resist film (PR) covering the other region than the region for a low-concentration source/drain region for a normal-voltage P-channel MOS transistor, boron difluoride ion, for example, is ion-implanted at an acceleration voltage of approximately 20 keV and a dose of $2 \times 10^{13}/cm^2$ to form low-concentration $P^-$ type source/drain regions 40.

Furthermore, a TEOS film 41 having approximately 250 nm is formed over the entire surface by the LPCVD process in a manner covering the gate electrodes 38A, 38B, 38C, 38D, 38E, 38F, 38G. The TEOS film 41 is anisotropically etched through a mask of a resist film (PR) having openings in the region for normal-voltage N-channel and P-channel MOS transistors. This forms sidewall spacer films 41A on the sidewalls of the gate electrode 38A, 38B, as shown in FIG. 18A. The TEOS film 41 is left, as it is, in the region covered by the resist film (PR).

Then, using the gate electrode 38A, sidewall spacer films 41A, gate electrode 38B and sidewall spacer films 41A as a mask, high-concentration source/drain regions are formed for normal-voltage N-channel and P-channel MOS transistors.

Namely, using a not-shown resist film covering the other region than the region of high-concentration source/drain regions for a normal-voltage N-channel MOS transistor as a mask, arsenic ion, for example, is ion-implanted at an acceleration voltage of approximately 100 keV and a dose of $5 \times 10^{15}/cm^2$ thereby forming high-concentration $N^+$ source/drain regions 42. Also, using a not-shown resist film covering the other region than the region of high-concentration source/drain regions for a normal-voltage P-channel MOS transistor as a mask, boron difluoride ion, for example, is ion-implanted at an acceleration voltage of approximately 40 keV and a dose of $2 \times 10^{10}/cm^2$ thereby forming high-concentration $P^+$ source/drain regions 43.

Although explanation with showing is omitted from now on, an interlayer insulating film, including TEOS and BPSG films, is formed to approximately 600 nm and, thereafter, a metal interconnection layer is formed to have contact to the source/drain regions 30, 31, 42, 43. Thus, completed are normal-voltage N-channel and P-channel MOS transistors, a level-shifter N-channel MOS transistor, high-voltage N-channel and P-channel MOS transistors, and high-voltage N-channel and P-channel DMOS transistors reduced in on-resistance, to constitute a display driver such as a liquid-crystal display driver and an electroluminescence driver.

Incidentally, in the above explained the embodiment, the P type well regions 2, 22 are formed in the step lower region because of forming precise MOS transistors on the P type well regions 2, 22. The invention is not limited to this, i.e. where forming precise MOS transistors on the N type well region 3, 23, the N type well regions 3, 23 are formed in the step lower region.

Meanwhile, the invention is applicable in adjusting the linewidth of a gate electrode to be formed on each step on the basis of step height difference data.

Furthermore, the invention is not limited to the case to pattern gate electrodes but may be applied to the case that, where a pattern of interconnection or the like is formed on a semiconductor substrate having a step on a surface thereof, a pattern is formed finer in a step lower region as compared to that of a step higher region thereby reducing the affection of linewidth variation.

Still further, except the liquid-crystal diriver and the electroluminescence driver explained above, the invention is also applicable to various flat panel display drivers such as LED display, PDP (Plasma Display Panel) and FED (Field Emission Display).

According to the present invention, when structuring a certain pattern on a semiconductor substrate having a step on a surface thereof, in a step lower region is formed a precise pattern as compared to a pattern in a step higher region thereby making possible to reduce the affection of linewidth variation.

Accordingly, where structuring, for example, first and second transistors on a semiconductor substrate having such a step on a surface thereof, a precise transistor is arranged in a step lower region and a transistor comparatively large in linewidth in a step higher region whereby the affection of linewidth variation can be reduced thus facilitating the use of a micro-fabrication process together.

What is claimed is:

1. A semiconductor device comprising:
   a first transistor having a first gate linewidth formed in a first step region and;
   a second transistor having a second gate linewidth in a second step region on a semiconductor substrate having a step on a surface thereof,
   wherein the second step region is higher than the first step region, and
   wherein the second gate linewidth is greater than the first gate linewidth.

2. A semiconductor device formed on a semiconductor substrate having a step on a surface thereof comprising:
   a first transistor having a first linewidth formed in one of a semiconductor region of one conductivity type and a semiconductor region of opposite conductivity type formed in a step lower region; and
   a second transistor having a second linewidth greater than a linewidth of the first transistor formed in one of a semiconductor region of the one conductivity type and a semiconductor region of the opposite conductivity type formed in a step higher region.

3. The semiconductor device according to claim 2, wherein the first transistor constitutes a normal-voltage MOS transistor and the second transistor constitutes a high-voltage.

4. A semiconductor device comprising:
   a semiconductor region of one conductivity type and a semiconductor region of opposite conductivity type formed on a semiconductor substrate of the one conductivity type having a step forming a boundary between the semiconductor region of one conductivity type and the semiconductor region of opposite conductivity type;
   a first gate electrode formed on one of the semiconductor region of one conductivity type and the semiconductor region of opposite conductivity type formed in a step lower region through a first gate oxide film;
   a first transistor formed in the vicinity of the first gate electrode with a first source/drain region opposite in conductivity type to the semiconductor region formed in the step lower region;
   a second gate electrode formed on one of the semiconductor region of one conductive type and the semiconductor region of opposite conductive type formed in a step higher region through a second gate oxide film, and the second gate electrode having a linewidth greater than the first gate electrode; and
   a second transistor formed in the vicinity of the second gate electrode with a second source/drain region opposite in conductivity type to the semiconductor region.

5. The semiconductor device according to claim 4, wherein the first transistor constitutes a normal-voltage MOS transistor and the second transistor constitutes a high-voltage MOS transistor.

* * * * *